United States Patent
Son et al.

(10) Patent No.: US 8,362,690 B2
(45) Date of Patent: Jan. 29, 2013

(54) SEALING METHOD FOR DISPLAY ELEMENT

(75) Inventors: Jung-Hyun Son, Hwaseong (KR); Han-Bok Joo, Hwaseong (KR); Sang-Kyu Lee, Hwaseong (KR); Jong-Dai Park, Hwaseong (KR)

(73) Assignee: Dongjin Semichem Co., Ltd., Incheon (KR)

( * ) Notice: Subject to any disclaimer, the term of this patent is extended or adjusted under 35 U.S.C. 154(b) by 89 days.

(21) Appl. No.: 12/177,494

(22) Filed: Jul. 22, 2008

(65) Prior Publication Data

US 2009/0029623 A1    Jan. 29, 2009

(30) Foreign Application Priority Data

Jul. 27, 2007   (KR) .................. 10-2007-0075459

(51) Int. Cl.
*H01L 27/32* (2006.01)
*H01L 27/28* (2006.01)

(52) U.S. Cl. ............... 313/504; 445/23; 445/24; 445/25

(58) Field of Classification Search .................. 313/504; 445/23–25

See application file for complete search history.

(56) References Cited

U.S. PATENT DOCUMENTS

| | | | | |
|---|---|---|---|---|
| 6,586,496 | B1* | 7/2003 | Takamatsu et al. | 522/168 |
| 7,462,651 | B2* | 12/2008 | Cao et al. | 522/74 |
| 2004/0152392 | A1* | 8/2004 | Nakamura | 445/25 |
| 2005/0275348 | A1* | 12/2005 | Choi et al. | 313/512 |
| 2007/0170849 | A1* | 7/2007 | Park | 313/506 |

* cited by examiner

*Primary Examiner* — Joseph L Williams
*Assistant Examiner* — Nathaniel Lee
(74) *Attorney, Agent, or Firm* — Lexyoume IP Meister, PLLC

(57) ABSTRACT

The present invention relates to a sealing method for a display element, and more particularly, to a sealing method for a display element which fundamentally prevents an error due to contact between light emitting bodies of upper and lower sealing members by protecting a surface of a light emitting layer and an electrode with a curing body of a photocurable transparent composition, enhances workability of a display element sealing, provides good moisture resistance and adhesiveness and improves an aperture ratio of a display element by making a top emission available to thereby make a thinner, larger display element.

13 Claims, 1 Drawing Sheet

[Figure 1]
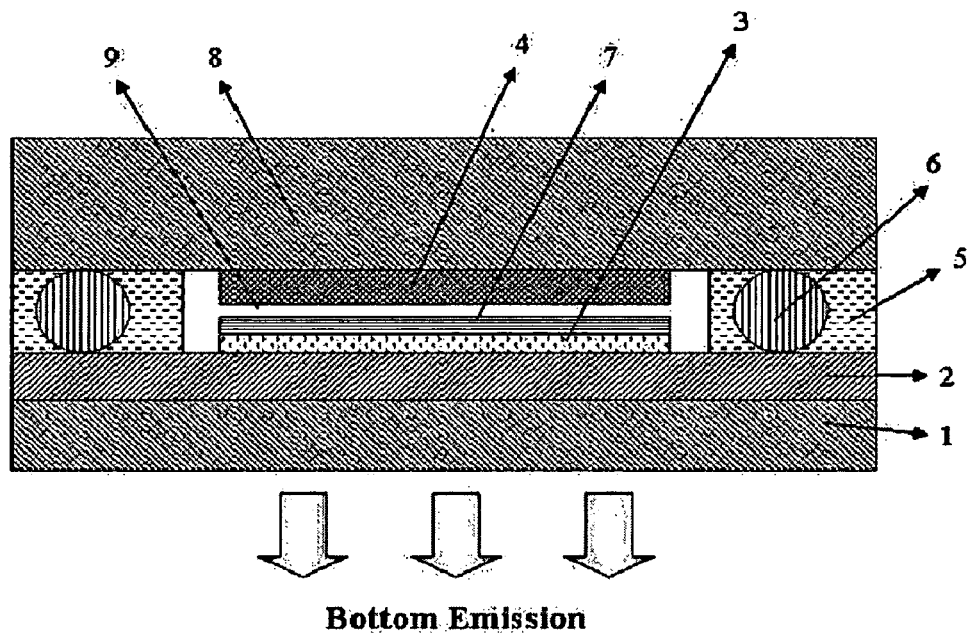
Bottom Emission
[Figure 2]
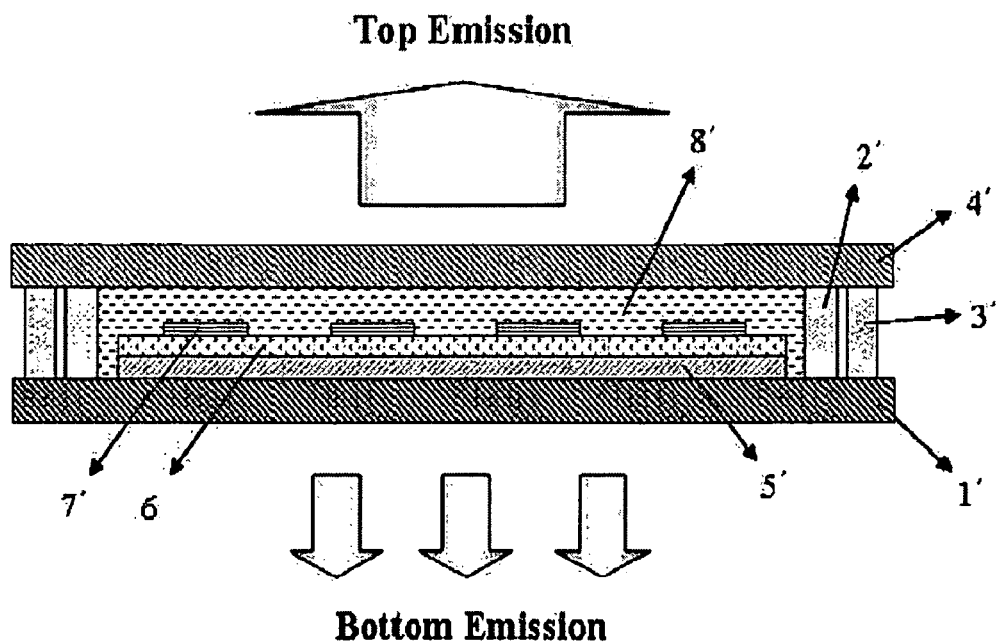
Bottom Emission

SEALING METHOD FOR DISPLAY ELEMENT

CROSS-REFERENCE TO RELATED APPLICATIONS

This application claims priority from Korean Patent Application No. 2007-0075459, filed on Jul. 27, 2007, in the Korean Intellectual Property Office, the disclosure of which is incorporated herein by reference.

BACKGROUND OF THE INVENTION

1. Field of the Invention

The present invention relates to a sealing method for a display element, and more particularly, to a sealing method which applies to an organic light emitting diode (OLED) or an organic thin film transistor (OTFT) element.

2. Description of the Related Art

Recently, studies about an organic thin film transistor (OTFT) and organic light emitting diode (OLED) as a display element have been actively carried out. The display element should be sealed before applying to a display device.

Conventionally, an end part of a lower sealing member and an upper sealing member are sealed by a sealing composition. However, while demands for a larger display element such as OLED grew, the conventional sealing method damaged a light emitting body of the lower sealing member as a gap is pressed and the upper and lower sealing members contact each other.

To address such a problem, Korean Patent First Publication No. 2007-0007904 discloses a sealing method of using a sealing adhesive composition including large spacers with an adhesion drying layer. However, this method makes a top emission unavailable due to the adhesion drying layer and still does not resolve the contact issue of the upper sealing member and the light emitting body as well as lowering workability of sealing.

SUMMARY OF THE INVENTION

Accordingly, it is an aspect of the present invention to provide a sealing method for a display element which protects a surface of a light emitting layer and an electrode with a curing body of a photocurable transparent composition to fundamentally prevent an error due to a contact between light emitting bodies of upper and lower sealing members, enhances workability of display element sealing, is highly moisture proof and adhesive, enables a top emission to improve an aperture ratio of a display element and greatly contributes to making a thinner, larger display element, a display element sealed by the same and a display device comprising the display element.

Additional aspects and/or advantages of the present invention will be set forth in part in the description which follows and, in part, will be obvious from the description, or may be learned by practice of the present invention.

The foregoing and/or other aspects of the present invention are also achieved by providing a sealing method for a display element in which a lower sealing member having an anode, a light emitting layer and a cathode on a lower substrate and upper sealing member are provided, the sealing method comprising a) applying a photocurable transparent composition across a surface of the upper sealing member or lower sealing member; b) adhering the upper and lower sealing members together having the photocurable transparent composition; and c) emitting light to the adhered upper and lower sealing members and curing the photocurable transparent composition.

Preferably, the photocurable transparent composition comprises i) an epoxy resin of 100 wt %, ii) a photo polymerization initiator of 0.01 to 20 wt % and iii) a coupling agent of 0.01 to 10 wt %.

The foregoing and/or other aspects of the present invention are also achieved by providing a display element which is manufactured by the sealing method. Preferably, the display element comprises an organic light emitting diode (OLED) element. Preferably, the OLED element further comprises a getter or a glass frit.

The foregoing and/or other aspects of the present invention are also achieved by providing a display device which comprises the display element.

BRIEF DESCRIPTION OF THE DRAWINGS

The above and/or other aspects of the present invention will become apparent and more readily appreciated from the following description of the embodiments, taken in conjunction with the accompanying drawings of which:

FIG. 1 illustrates a display element which is sealed by a conventional sealing method for a display element; and FIG. 2 illustrates a display element which is sealed by a sealing method according to an exemplary embodiment 1 of the present invention.

REFERENCE NUMBER OF DRAWING

1: Glass Substrate, 2: Anode, 3: Organic Layer, 4: Adhesion drying layer, 5: Adhesive composition for sealing, 6: Spacer, 7: Cathode, 8: Glass sealing, 9: Gap or space

1': Lower glass substrate, 2': Getter, 3': Glass frit, 4: Upper Glass substrate, 5': Anode, 6': Light emitting layer, 7': Cathode, 8': photocurable transparent composition

DETAILED DESCRIPTION OF EXEMPLARY EMBODIMENT

Hereinafter, exemplary embodiments of the present invention will be described with reference to accompanying drawings, wherein like numerals refer to like elements and repetitive descriptions will be avoided as necessary.

Hereinafter, the present invention will be described in detail.

The present invention is provided by the inventors who found that an error due to a contact between light emitting bodies of upper and lower sealing members is fundamentally prevented, workability of a display element sealing is enhanced, moisture resistance and adhesiveness are excellent, a top emission is available to improve an aperture ratio of a display element and a display element becomes thinner and larger if a surface of a light emitting layer and an electrode is protected by a curing body of a photocurable transparent composition and the upper and lower sealing members are adhered to each other by the curing body of the photocurable transparent composition without a gap.

A sealing method for a display element according to the present invention, in which a lower sealing member having an anode, a light emitting layer and a cathode on a lower substrate and upper sealing member are provided comprises a) applying a photocurable transparent composition across a surface of the upper sealing member or lower sealing member; b) adhering the upper and lower sealing members together having the photocurable transparent composition;

and c) emitting light to the adhered upper and lower sealing members and curing the photocurable transparent composition. Preferably, the display element comprises OTFT or OLED element.

The photocurable transparent composition according to the present invention comprises i) an epoxy resin of 100 wt %, ii) a photo polymerization initiator of 0.01 to 20 wt % and iii) a coupling agent of 0.01 to 10 wt %.

The i) epoxy resin assigns adhesiveness to a photocurable transparent composition, and preferably includes an aromatic epoxy resin, a cyclo aliphatic epoxy resin, a combination thereof or a copolymer of a compatible monomer. The aromatic epoxy resin may include biphenyl, bisphenol A, bisphenol F, novolac, dicyclopentadiene epoxy resin, and more preferably, bisphenol A or bisphenol F epoxy resin to be used alone or mixed together. Here, biphenyl or cyclo aliphatic epoxy resin may be mixed thereto. If biphenyl or aliphatic epoxy resin is mixed, bisphenol A or bisphenol F epoxy resin of 50 to 99 wt % and biphenyl or cyclo alphatic epoxy resin or 1 to 50 wt % may be mixed to be used. In this case, light transmittance and moisture resistance improve.

The ii) photopolymerization initiator may include aromatic diazonium salt, aromatic sulfonium salt, aromatic iodonium aluminum salt, aromatic sulfonium aluminum salt, metallocene compound or steel arene compound, but not limited thereto. Alternatively, the photopolymerization initiator may vary as long as it polymerizes the epoxy resin by light. Preferably, the photopolymerization initiator includes aromatic sulfonium salt, and more specifically, aromatic sulfonium hexa fluoro phosphate compound and aromatic sulfonium hexa fluoro antimonite. In this case, not only photocurability but also adhesiveness of photocurable transparent composition may further improve. The photopolymerization initiator in the photocurable transparent composition may be 0.01 to 20 wt %, preferably 0.1 to 10 wt %, and more preferably, 1 to 6 wt % with respect to an epoxy resin of 100 wt %. If the photopolymerization initiator is within the range, photocurability, transparency, adhesiveness and moisture resistance of the photocurable transparent composition may be satisfied at the same time.

The iii) coupling agent facilitates adhesiveness of the photocurable transparent composition. The coupling agent may include a silane or titan coupling agent or a silicon compound alone or together. The coupling agent in the photocurable transparent composition may be 0.01 to 10 wt %, preferably 0.1 to 5 wt %, and more preferably, 0.1 to 2 wt % with respect to an epoxy resin of 100 wt %. If the coupling agent is within the range, photocurability, transparency, adhesiveness and moisture resistance of the photocurable transparent composition may be satisfied at the same time.

The photocurable transparent composition may further include an inorganic filler, a photoacid generator (PAG), an acid amplifier or other additives compatible with the photocurable transparent composition.

The inorganic filler may include a plate-shaped or circular inorganic filler such as talc, silica, magnesium oxide, mica, montmorillonite, alumina, graphite, beryllium oxide, aluminum nitride, silicon carbide, mullite, silicon, etc., or an inorganic filler having a diameter or longer side of 0.1 to 20 µm introducing a substituent to the organic filler. Preferably, the inorganic filler may include talc alone or talc and other inorganic fillers at a weight ratio of 10:90 to 99:1. In this case, dispersibility and adhesiveness of the photocurable transparent composition may further improve. The inorganic filler in the photocurable transparent composition may be 0.1 to 100 wt %, and more preferably, 1 to 30 wt % with respect to an epoxy resin of 100 wt %. If the inorganic filler is within the range, photocurability, transparency, adhesiveness and moisture resistance of the photocurable transparent composition may be satisfied at the same time.

The photoacid generator may include a sulfonate compound such as organic sulfonic acid and an onium compound such as onium salt, but not limited thereto. The photoacid generator may vary as long as it generates base or bronsted acid by exposure. Preferably, the photoacid generator may include phthalimidotrifluoromethansulfonate, dinitrobenzyltosylate, n-decyldisulfon, naphthylimidotrifluoromethansulfonate, diphenyliodo salt hexafluorophospate, diphenyliodo salt hexafluoroarsenate, diphenyliodo salt hexafluoroantimonate, diphenyl-p-methoxyphenylsulfonium triflate, diphenyl-p-toluenylsulfonium hexafluoro triflate, diphenyl-p-isobutylphenylsulfonium triflate, triphenylsulfonium hexafluoro arsenate, triphenylsulfonium hexafluoro antimonite, triphenylsulfonium triflate, dibutylnaphtylsulfonium triflate and a mixture thereof. The photoacid generator in the photocurable transparent composition may be 0.05 to 10 wt % with respect to an epoxy resin of 100 wt %. If the photoacid generator is within the range, photocurability, transparency, adhesiveness and moisture resistance of the photocurable transparent composition may be satisfied at the same time.

Preferably, the photocurable transparent composition according to the present invention has light transparency of 90 to 99%, and more preferably, 95 to 99% when cured. If the photocurable transparent composition has light transparency at this level, the surface of the light emitting layer and electrode are protected by a curing body of the photocurable transparent composition and the upper and lower sealing members are adhered to each other completely by the curing body thereof. Also, instead of bottom emission, top emission is available to thereby increase an aperture ratio of the display element.

Preferably, the viscosity of the photocurable transparent composition ranges from 500 to 50,000 cps, and more preferably, 2,000 to 35,000. If the viscosity is within the range, the photocurable transparent composition can be applied by screen printing to further improve workability of the sealing. If the viscosity is too high, workability of the sealing and reliability of the display element may deteriorate as the curing body includes too much bubble after the photocurable transparent composition is cured. If the viscosity is too low, the photocurable transparent composition runs down and workability of the sealing may be lowered.

The sealing method for the display element according to the present invention includes an operation of applying the photocurable transparent composition to a surface of the upper or lower sealing member. Preferably, the photocurable transparent composition is applied to the upper sealing member for workability.

More specifically, the lower sealing member may include an anode, a light emitting layer and a cathode sequentially on a lower substrate, and preferably, a hole injecting layer (HIL), a hole transporting layer (HTL), an electron injecting layer (EIL) or an electron transporting layer (ETL). The lower substrate, anode, light emitting layer, cathode, hole injecting layer, hole transporting layer, electron injecting layer or electron transporting layer may be formed by a known method.

The upper sealing member may include a sealing member which is used to seal the display element, and preferably, further include a getter or glass frit to tightly seal the upper substrate and for stability of the display element. The method of forming a getter or glass frit on the upper substrate is disclosed in Korean Patent First Publication No. 2005-0046625, 2007-0011113, 2006-0005369 or 2006-0011831.

More preferably, a paste composition and getter composition for the glass frit may include a paste composition which has a composition as in Tables 1 (glass frit) and 2 (getter). The getter and glass frit paste composition may further improve moisture resistance. The glass frit paste may be manufactured by mixing glass frit and solvent having components in Table 1. Here, the content of the glass frit is 10 to 95 wt %. Getter powder in Table 2 may include zeolite, alumina, silica, alkaline metal salt or alkaline earth metal oxide. An organic vehicle may include an organic solvent mixed with a binder such as ethylcellulose of 5 to 10 wt %.

TABLE 1

| Component of Glass Frit | Content (mole %) |
|---|---|
| $P_2O_5$ | 0-20 |
| $V_2O_5$ | 0-47 |
| ZnO | 0-15 |
| BaO | 1-15 |
| $As_2O_3$ | 0-20 |
| $Sb_2O_3$ | 0-10 |
| $Fe_2O_3$ | 0-10 |
| $B_2O_3$ | 0-20 |
| $Bi_2O_3$ | 0-10 |
| $TiO_2$ | 0-10 |

TABLE 2

| Component of Getter Paste | Content (wt %) |
|---|---|
| Glass Frit shown in Table 1 | 1-90 |
| Getter Powder | 1-90 |
| Organic Vehicle | 1-80 |
| Solvent | 0-30 |

The photocurable transparent composition may be applied to the sealing member by a screen printing for accuracy and workability.

The sealing method for the display element according to the present invention includes an operation of adhering the upper and lower sealing members together having the photocurable transparent composition. The adhering operation may be performed under a vacuum atmosphere of below $10^{-6}$ torr under nitrogen atmosphere, and more preferably, under a vacuum atmosphere of below $10^{-7}$ torr. If the adhering operation is performed under the vacuum atmosphere, bubble is removed from the curing body after the curing of the photocurable transparent composition, to thereby prevent light dispersion or lowering transparency.

Also, the sealing method for the display element according to the present invention includes an operation of emitting light to the adhered upper and lower sealing members to cure the photocurable transparent composition. The light may include e.g. ultraviolet rays, but not limited thereto. Alternatively, the light may vary as long as it cures the photocurable transparent composition. The photocurable transparent composition is cured by the emitted light to thereby form the curing body, which tightly seals the upper and lower sealing members.

The present invention provides a display element which is sealed by the sealing method for the display element. The display element may include an OLED or OTFT.

In the display element according to the present invention, the curing body of the photocurable transparent composition protects the surface of the light emitting layer and electrode and tightly seals the upper and lower sealing members without a gap. Thus, an error due to contact between light emitting bodies of the upper and lower sealing members may fundamentally be prevented. Also, the moisture resistance and adhesiveness are excellent, a top emission is available to improve an aperture ratio of a display element and a display element becomes thinner and larger.

The display element according to the present invention may include a lower sealing member which sequentially has an anode, a light emitting layer and a cathode on a lower substrate, and preferably, further include a hole injecting layer, a hole transporting layer, an electron injecting layer or an electron transporting layer. An upper sealing member may further include a getter or glass frit.

Hereinafter, exemplary embodiments according to the present invention are provided to help understand the present invention. The exemplary embodiments exemplify the present invention, but not limit the scope of the present invention thereto.

Exemplary Embodiment

Fabrication Example 1

Fabrication of Photocurable Transparent Composition

Bisphenol A epoxy resin (Epikote 828 manufactured by Japan Epoxy) of 100 wt % was added with a cationic polymerization initiator (Adecaoptomer manufactured by Asahi denca) of 3 wt % and a silane coupling agent (KBM403 manufactured by Shinetz) of 0.2 wt %. The mixture was stirred and removed with bubble to make a photocurable transparent composition.

Fabrication Example 2

Fabrication of Photocurable Transparent Composition

A photocurable transparent composition was made by the same method as the fabrication example 1 except that the bisphenol A epoxy resin was replaced with bisphenol F epoxy resin (YL983U manufactured by Japan Epoxy).

Fabrication Example 3

Fabrication of Photocurable Transparent Composition

A photocurable transparent composition was made by the same method as the fabrication example 1 except that the bisphenol F epoxy resin (YL983U manufactured by Japan Epoxy) of 80 wt % and biphenyl epoxy resin (NC-3000H manufactured by Nipponkayaku) of 20 wt % were used instead of the bisphenol F epoxy resin of 100 wt % in the fabrication example 2.

Fabrication Example 4

Fabrication of Photocurable Transparent Composition

A photocurable transparent composition was made by the same method as the fabrication example 1 except that the bisphenol F epoxy resin (YL983U manufactured by Japan Epoxy) of 80 wt % and cyclo alphatic epoxy resin (EHPH-3150 manufactured by Dicel) of 20 wt % were used instead of the bisphenol F epoxy resin of 100 wt % in the fabrication example 2.

Fabrication Example 5

Fabrication of Photocurable Transparent Composition

A photocurable transparent composition was made by the same method as the fabrication example 2 except that the bisphenol F epoxy resin (YL983U manufactured by Japan Epoxy) of 85 wt %, biphenyl epoxy resin (NC-3000H manufactured by Nipponkayaku) of 15 wt % and talc having an average longer side of 8 μm of 20 wt % were used instead of the bisphenol F epoxy resin of 100 wt % in the fabrication example 2.

Fabrication Example 6

Fabrication of Photocurable Transparent Composition

A photocurable transparent composition was made by the same method as the fabrication example 5 except that the biphenyl epoxy resin of 15 wt % was replaced with naphtholnovolac epoxy resin (NC-7300L manufactured by Nippon Kayaku) of 15 wt % in the fabrication example 5.

Fabrication Example 7

Fabrication of Photocurable Transparent Composition

A photocurable transparent composition was made by the same method as the fabrication example 5 except that the biphenyl epoxy resin of 15 wt % was replaced with dicyclopentadiene epoxy resin (XD-1000 manufactured by Nipponkayaku) of 15 wt %.

Fabrication Example 8

Fabrication of Photocurable Transparent Composition

A photocurable transparent composition was made by the same method as the fabrication example 5 except that the biphenyl epoxy resin of 15 wt % was replaced with cyclo aliphatic epoxy resin (EHPH-3150 manufactured by Dicel) of 15 wt %.

Light transmittance, moisture transmittance, adhesiveness and thermal stability of the photocurable transparent composition according to the fabrication examples 1 to 8 were measured. The measurement result is shown in Table 3.

To measure light transmittance, the photocurable transparent composition according to the fabrication examples 1 to 8 was coated in 20 μm to a transparent glass substrate (Eagle 2000 manufactured by Samsung Corning) of 50 mm×0.7 mm with a bar applicator and then UV of 6000 mJ/cm$^2$ was emitted to the glass substrate. The light transmittance with respect to a reference glass substrate (Eagle 2000 manufactured by Samsung Corning) was measured by MCPD-3000, an optical spectrum analysis device manufactured by Otsuka. Six point specific transmittance of the glass substrate coated with the photocurable transparent composition was measured in a wavelength of 380 to 780 nm and an average value of the transmittance was used.

To measure moisture transmittance, the photocurable transparent composition according to the fabrication examples 1 to 8 was coated in 50 mm×50 mm×0.1 mm to a surface of a polyethyleneterephthalate film with a bar applicator. Twenty-four hours after UV of 6000 mJ/cm$^2$ was emitted, the moisture transmittance was measured by a moisture transmittance measuring device, PERMATRAN-W3/33, for 24 hours with ASTM F1249 at 37.8° C. and 90% RH.

To measure adhesiveness, the photocurable transparent composition according to the fabrication examples 1 to 8 was dropped in a diameter of 5 mm on a substrate having a glass lower plate of 50 mm×50 mm×1.1 mm. Then, an upper plate, which is the same as the lower plate, was adhered to the lower plate. Twenty-four hours after UV of 6000 mJ/cm$^2$ was emitted, adhesiveness was measured by an adhesiveness measuring device, UTM-5566 manufactured by Instrone, with a T type jig (Stud set manufactured by Instron).

To measure thermal stability, the photocurable transparent composition according to the fabrication examples 1 to 8 was coated in 50 mm×50 mm×0.1 mm to a surface of a release-treated polyethyleneterephthalate film with a bar applicator. Twenty-four hours after UV of 6000 mJ/cm$^2$ was emitted, a part of the coating film was cut out to measure glass transition temperature (Tg) of the photocurable transparent composition with a differential scanning calorimetry, DSC manufactured by TA.

TABLE 3

|  | Light transmittance (%) | Moisture transmittance (g/m$^2$/day) | Adhesiveness (kgf/cm$^2$) | Thermal stability (Tg) | Viscosity (cps) |
| --- | --- | --- | --- | --- | --- |
| Fab. Ex. 1 | 97.7 | 9.97 | 69.7 | 114 | 7,423 |
| Fab. Ex. 2 | 96.6 | 8.84 | 86.2 | 107 | 2,876 |
| Fab. Ex. 3 | 95.1 | 8.66 | 58.5 | 106 | 18,460 |
| Fab. Ex. 4 | 97.6 | 9.66 | 53.3 | 98 | 15,466 |
| Fab. Ex. 5 | 90.2 | 8.05 | 90.6 | 106 | 34,009 |
| Fab. Ex. 6 | 90.1 | 7.21 | 110 | 121 | 23,400 |
| Fab. Ex. 7 | 90.2 | 8.10 | 95.1 | 105 | 28,085 |
| Fab. Ex. 8 | 92.9 | 7.92 | 90.3 | 115 | 29,950 |

As shown in Table 3, the photocurable transparent composition according to the fabrication examples 1 to 8 has good light transmittance, moisture transmittance, adhesiveness and thermal stability.

Exemplary Embodiment 1

Sealing of Display Element

A lower sealing member sequentially having an anode, a light emitting layer and a cathode on a lower substrate and an upper sealing member having a getter and glass frit were provided. The photocurable transparent composition according to the fabrication example 1 was applied to a surface of the upper sealing member by screen printing. After the upper sealing member having the photocurable transparent composition was adhered to the lower sealing member under a vacuum atmosphere of 10$^{-7}$ torr under nitrogen atmosphere, UV of 6000 mJ/cm$^2$ was emitted to cure the photocurable transparent composition. As shown in FIG. 2, the getter and glass frit formed by a sealing pattern were sealed by laser which was emitted under conditions of 13 mm/sec with intra-gra-MP of Spectra-physics.

Even though there was a space between the upper and lower sealing members in the conventional art, the display element which was manufactured according to the exemplary embodiment 1 of the present invention was tightly adhered by the photocurable transparent composition as in FIG. 2. The display element which is manufactured according to the exemplary embodiment 1 of the present invention has good light transmittance, moisture transmittance, adhesiveness and thermal stability. Also, damage due to contact between light emitting bodies of the upper and lower sealing members may fundamentally be prevented.

Exemplary Embodiment 2-8

Sealing of Display Element

A display element was sealed by the photocurable transparent composition manufactured according to fabrication examples 2 to 8 with the same method as the exemplary embodiment 1. The display element which is sealed by the photocurable transparent composition manufactured according to fabrication examples 2 to 8 has good light transmittance, moisture transmittance, adhesiveness and thermal stability.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

Advantageous Effect

The sealing method for a display element and a display element sealed by the method according to the present invention fundamentally prevents an error due to contact between light emitting bodies of upper and lower sealing members by protecting a surface of a light emitting layer and an electrode with a curing body of a photocurable transparent composition, enhances workability of a display element sealing, provides good moisture resistance and adhesiveness and improves an aperture ratio of a display element by making a top emission available to thereby make a thinner, larger display element.

What is claimed is:

1. A sealing method for an organic light emitting diode (OLED) device, the sealing method comprising:
providing (a) a lower sealing member having an anode, a light emitting layer, a cathode and a lower substrate, (b) an upper sealing member, and (c) at least one of a getter and a glass frit;
applying a photocurable transparent composition to at least a portion of one of the upper and lower sealing members;
adhering the upper and lower sealing members together such that at least one of the getter and the glass frit is positioned on opposite sides of the anode and extends between the upper and lower sealing members; and
curing the photocurable transparent composition by exposing the upper and lower sealing members to light,
wherein the at least one of the getter and the glass frit comprises
between about 0 mole % and about 20 mole % of $P_2O_5$,
between about 0 mole % and about 47 mole % of $V_2O_5$,
between about 0 mole % and about 15 mole % of ZnO,
between about 1 mole % and about 15 mole % of BaO,
between about 0 mole % and about 20 mole % of $As_2O_3$,
between about 0 mole % and about 10 mole % of $Sb_2O_3$,
between about 0 mole % and about 10 mole % of $Fe_2O_3$,
between about 0 mole % and about 20 mole % of $B_2O_3$,
between about 0 mole % and about 2.5 mole % of $Bi_2O_3$, and
between about 0 mole % and about 10 mole % of $TiO_2$,
wherein the photocurable transparent composition comprises i) an epoxy resin including bisphenol A or bisphenol F epoxy resin of 50 to 99 wt % and biphenyl or cyclo aliphatic epoxy resin of 1 to 50 wt % mixed together, ii) a photo initiator of 0.01 to 20 wt % and iii) a coupling agent of 0.01 to 10 wt %.

2. The sealing method according to claim 1, wherein the photocurable transparent composition has a light transmittance of between about 90% and about 99%.

3. The sealing method according to claim 1, wherein the epoxy resin includes the cyclo aliphatic epoxy resin, but does not include the biphenyl epoxy resin.

4. The sealing method according to claim 1, wherein a viscosity of the photocurable transparent composition ranges from about 500 cps to about 50,000 cps.

5. The sealing method according to claim 1, wherein the photocurable transparent composition further comprises at least one of (a) between about 0.05 wt % and about 10 wt % of a photoacid generator, and (b) between about 0.1 wt % and about 100 wt % of an organic filler.

6. The sealing method according to claim 1, wherein the photocurable transparent composition is applied using a screen printing process.

7. The sealing method according to claim 1, wherein the upper and lower sealing members are adhered without using a catalyst under a nitrogen atmosphere at below $10^{-6}$ torr.

8. The sealing method according to claim 1, wherein the lower sealing member further comprises at least one of a hole injecting layer, a hole transporting layer, an electron injecting layer and an electron transporting layer.

9. A display element which is manufactured by the sealing method according to claim 1.

10. The display element according to claim 9, wherein the display element comprises at least one of a hole injecting layer, a hole transporting layer, an electron injecting layer and an electron transporting layer.

11. A display device which comprises the display element according to claim 9.

12. The method of claim 1, wherein:
both the getter and the glass frit are positioned on the opposite sides of the anode and extend between the upper and lower sealing members;
the getter is positioned between the glass frit and the anode; and
the getter and the glass frit have different material compositions.

13. The method of claim 1, wherein curing the photocurable transparent composition comprises exposing the photocurable transparent composition to ultraviolet light at about 6000 mJ $cm^{-2}$.

* * * * *